United States Patent
Sasaki et al.

(10) Patent No.: US 11,493,528 B2
(45) Date of Patent: Nov. 8, 2022

(54) POSITION SENSOR

(71) Applicant: DENSO CORPORATION, Kariya (JP)

(72) Inventors: Akito Sasaki, Kariya (JP); Atsushi Kobayashi, Kariya (JP); Michihiro Makita, Kariya (JP); Tetsuya Ohmi, Kariya (JP)

(73) Assignee: DENSO CORPORATION, Kariya (JP)

( * ) Notice: Subject to any disclaimer, the term of this patent is extended or adjusted under 35 U.S.C. 154(b) by 510 days.

(21) Appl. No.: 16/677,975

(22) Filed: Nov. 8, 2019

(65) Prior Publication Data

US 2020/0072863 A1 Mar. 5, 2020

Related U.S. Application Data

(63) Continuation of application No. PCT/JP2018/012266, filed on Mar. 27, 2018.

(30) Foreign Application Priority Data

Jun. 14, 2017 (JP) .............................. JP2017-117171

(51) Int. Cl.
 *F16H 59/08* (2006.01)
 *G01P 3/52* (2006.01)
 *F16H 61/02* (2006.01)
 *B60K 20/02* (2006.01)

(52) U.S. Cl.
 CPC ................. *G01P 3/52* (2013.01); *F16H 59/08* (2013.01); *F16H 61/02* (2013.01); *B60K 20/02* (2013.01)

(58) Field of Classification Search
 CPC ............. G01P 3/52; F16H 59/08; F16H 61/02
 See application file for complete search history.

(56) References Cited

U.S. PATENT DOCUMENTS

| | | | |
|---|---|---|---|
| 6,339,322 B1 | 1/2002 | Loreck et al. | |
| 2004/0214688 A1* | 10/2004 | Takasaki | F16H 61/12 477/115 |
| 2010/0318271 A1* | 12/2010 | Nishide | F16H 61/12 701/62 |

(Continued)

FOREIGN PATENT DOCUMENTS

| | | |
|---|---|---|
| EP | 0 871 011 A2 | 10/1998 |
| JP | H11-073226 A | 3/1999 |
| JP | 2009-002486 A | 1/2009 |

(Continued)

OTHER PUBLICATIONS

U.S. Appl. No. 16/676,645, filed Nov. 7, 2019, Kobayashi et al.
U.S. Appl. No. 16/697,806, filed Nov. 27, 2019, Kitaura et al.
U.S. Appl. No. 16/697,902, filed Nov. 27, 2019, Kobayashi et al.

*Primary Examiner* — Edwin A Young
(74) *Attorney, Agent, or Firm* — Posz Law Group, PLC

(57) ABSTRACT

A position sensor including: a power supply terminal to which a power supply voltage is applied; a ground terminal to which a ground voltage is applied; an output terminal that outputs a signal; a detection portion that operates based on the power supply voltage and the ground voltage, and detects a position of a detection target by a magnetic resistance element whose resistance value changes according to a movement of the detection target; and a signal processing portion that operates based on the power supply voltage and the ground voltage, and processes a signal input from the detection portion.

6 Claims, 10 Drawing Sheets

(56) References Cited

U.S. PATENT DOCUMENTS

2012/0016559 A1* 1/2012 Ueno .................. F16H 59/105
  701/55
2014/0375306 A1 12/2014 Moonamkandy et al.

FOREIGN PATENT DOCUMENTS

| JP | 2009-133459 A | 6/2009 |
| WO | 2013/179997 A1 | 1/2016 |
| WO | 2018/230242 A1 | 12/2018 |
| WO | 2018/230243 A1 | 12/2018 |
| WO | 2018/230244 A1 | 12/2018 |

* cited by examiner

| FAILURE<br>DETERMINATION | | FIRST SYSTEM | | |
|---|---|---|---|---|
| | | STATE A | STATE B | STATE C |
| SECOND<br>SYSTEM | STATE A | STATE A | FAILURE | FAILURE |
| | STATE B | FAILURE | STATE B | FAILURE |
| | STATE C | FAILURE | FAILURE | STATE C |

COMPARATIVE EXAMPLE

POSITION → VOLTAGE

VOLTAGE → STATE

POSITION SENSOR

CROSS REFERENCE TO RELATED APPLICATIONS

The present application is a continuation application of International Patent Application No. PCT/JP2018/012266 filed on Mar. 27, 2018 which designated the U. S. and claims the benefit of priority from Japanese Patent Application No. 2017-117171 filed on Jun. 14, 2017. The entire disclosures of all of the above applications are incorporated herein by reference.

TECHNICAL FIELD

The present disclosure relates to a position sensor outputting a signal corresponding to a position of a detection target.

BACKGROUND

A device that detects the position of a detection target has been known.

SUMMARY

The present disclosure describes a position sensor including: a power supply terminal; a ground terminal; an output terminal that outputs a signal; a detection portion that detects a position of a detection target; and a signal processing portion that processes a signal input from the detection portion.

BRIEF DESCRIPTION OF DRAWINGS

The above and other objects, features, and advantages of the present disclosure will become more apparent from the following detailed description with reference to the accompanying drawings. In the drawings.

DETAILED DESCRIPTION

Figure 1:
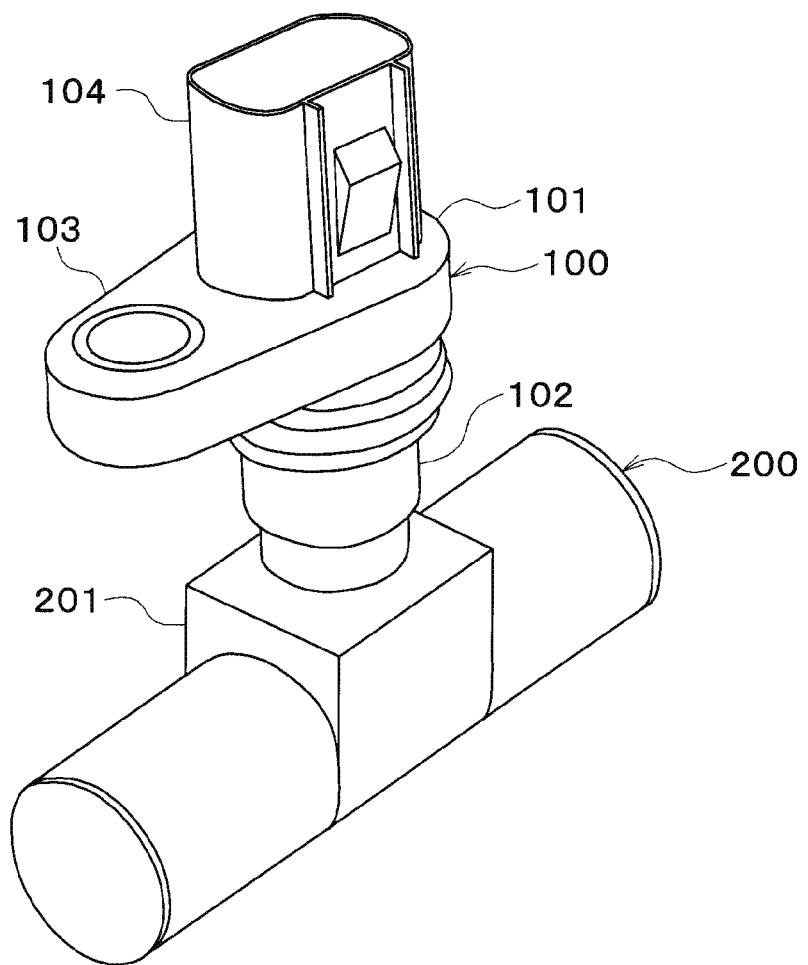
FIG. 1 is an appearance view of a position sensor according to a first embodiment of the present disclosure.

A device that detects the position of a detection target has been conventionally proposed in a related art. The device includes a plurality of switches that are switched on or off depending on the position of the detection target. When the detection target is moved to a specific position, each switch outputs an on-signal or an off-signal according to that position. In addition, it is possible to determine a failure of each switch based on a signal from the switch. It has been known that a detection portion has a dual system in order to improve the reliability of a device. As this configuration requires two output terminals, the device includes four terminals, that is, the two output terminals, a power supply terminal, and a ground terminal.

As a plurality of switches including the detection portion have the dual system in the configuration, it may be necessary to have the same number of output terminals as the number of the switches. It may be originally necessary to have the same number of the output terminals as the number of the switches. If the number of the switches increases twice, the number of the output terminals may also increase twice. The detection portion may become complicated and the number of wires connected to the output terminals may increase. In addition, it may be necessary to configure a program of determining a failure in a device that receives a signal from each switch.

The present disclosure describes a position sensor that is capable of improving the reliability of a detection portion detecting the position of a detection target while maintaining a configuration of three terminals, that is, a power supply terminal, a ground terminal, and an output terminal even if the detection portion has a dual system.

According to an aspect of the present disclosure, a position sensor may include a power supply terminal to which a power supply voltage is applied, a ground terminal to which a ground voltage is applied, an output terminal for outputting a signal, a detection portion that operates based on the power supply voltage and the ground voltage and detects a position of a detection target, and a signal processing portion that operates based on the power supply voltage and the ground voltage and processes a signal input from the detection portion.

The detection portion may include a first detection element that outputs a first detection signal corresponding to a position of the detection target and a second detection element that outputs a second detection signal corresponding to a position of the detection target.

The signal processing portion may include a first processing portion that inputs the first detection signal from the first detection element and specifies a position of the detection target based on the first detection signal, a second processing portion that inputs the second detection signal from the second detection element and specifies a position of the detection target based on the second detection signal, a failure determination portion that determines whether the position specified by the first processing portion matches the position specified by the second processing portion, and an output circuit that, when determinations by the failure determination portion match, outputs a position signal corresponding to a matching position to the output terminal and that, when the determinations by the failure determination portion do not match, outputs a failure signal corresponding to a failure to the output terminal.

With this configuration, if the detection portion has a dual system, a failure determination is made in the signal processing portion within the position sensor and a determination result is output from one output terminal as position information of the detection target or failure information. Consequently, even if the detection portion has the dual system, it is possible to improve the reliability of the detection portion while maintaining a configuration of three terminals, that is, the power supply terminal, the ground terminal, and the output terminal.

Embodiments of the present disclosure will be described below with reference to the drawings. In the following embodiments, the same reference numeral is given to the same or equivalent parts in the drawings.

First Embodiment

A first embodiment of the present disclosure will be described below with reference to the drawings. A position sensor according to the present embodiment detects a range (state) that covers the position of a detection target and outputs a signal according to that range.

As illustrated in FIG. 1, a position sensor 100 detects the position of a shaft 200 in conjunction with an operation of a shift position of a vehicle as a detection target. Specifically, the position sensor 100 detects a signal based on the position of a protrusion part 201 on the shaft 200 to acquire the state of the shaft 200.

The state of the shaft 200 means the position of the shaft 200 when the shift position is operated by a user. For example, the shaft 200 is moved in conjunction with a parking position of the shift position. As illustrated in FIG. 1, when the shift position is operated to be the parking position, the shaft 200 is axially moved. The shaft 200 thus reflects the state of the parking position. The position sensor 100 detects the position of the shaft 200 right before the protrusion part 201.

Meanwhile, when the shift position is operated to be a position other than the parking position, the shaft 200 reflects the state of that shift position other than the parking position. In this case, the position sensor 100 detects the position of the protrusion part 201 or the position of the shaft 200 right after the protrusion part 201. The shaft 200 may be moved in conjunction with a position other than the parking position.

The shaft 200 is entirely made of a magnetic material, for example. In the shaft 200, a surface of the protrusion part 201 opposing the position sensor 100 may be made of a magnetic material and other portions may be made of other metal materials.

The position sensor 100 includes a container 101 formed by molding a resin material such as polyphenylenesulfide (PPS). The container 101 includes a distal end part 102 on a side of the shaft 200, a flange 103 fixed to a peripheral mechanism, and a connector 104 to which a harness is connected. A sensing part is disposed within the distal end part 102.

The position sensor 100 is fixed via the flange 103 to the peripheral mechanism so that the distal end part 102 has a predetermined gap to the protrusion part 201 of the shaft 200. Consequently, the shaft 200 moves with respect to the position sensor 100.

Although not illustrated, the position sensor 100 may be fixed to the peripheral mechanism so as to detect the position of a valve operating in conjunction with the shaft 200. The movement direction of the shaft 200 is not limited to a straight direction and a reciprocal direction. The shaft 200 may rotate or reciprocate at a specific angle. As described above, the position sensor 100 can be used to detect the state of a movable component moving in conjunction with the operation of the vehicle shift position such as movement and rotation.

Figure 2:
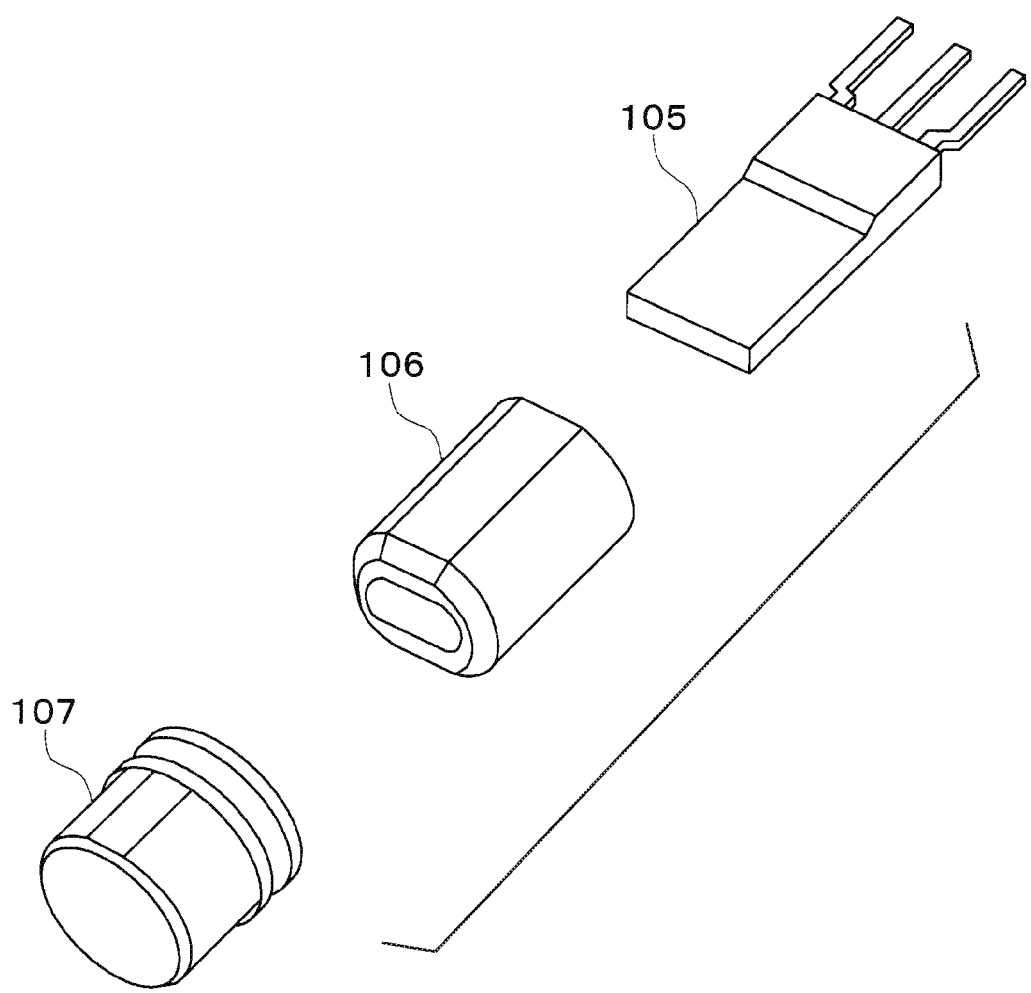
FIG. 2 is an exploded perspective view of components configuring a magnetic detection system using a magnetic resistance element.

The position sensor 100 may employ a magnetic detection system using a magnetic resistance element or a magnetic detection system using a Hall element. As illustrated in FIG. 2, in the case of the magnetic detection system using a magnetic resistance element, the position sensor 100 includes a mold IC 105, a magnet 106, and a holder 107. These components are housed in the distal end part 102 of the container 101. The mold IC 105 is inserted into the magnet 106 formed in a hollow cylindrical shape. The magnet 106 is inserted into the holder 107 formed in a cylindrical shape with a bottom.

Figure 3:
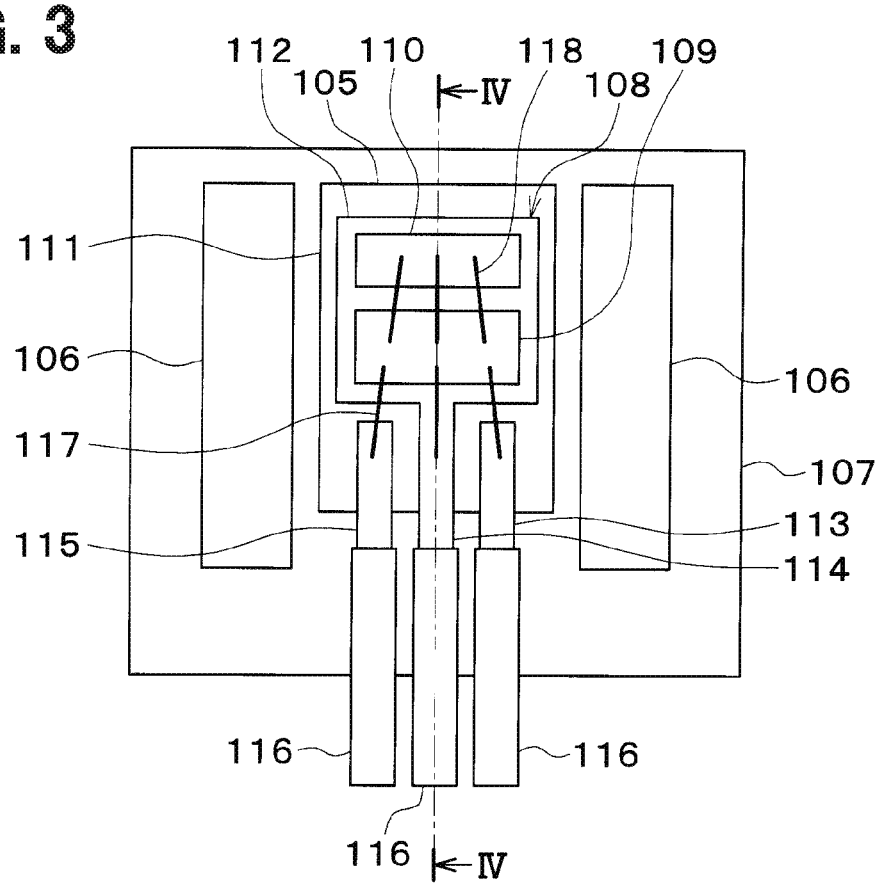
FIG. 3 is a plan view of the respective components illustrated in FIG. 2.
Figure 4:
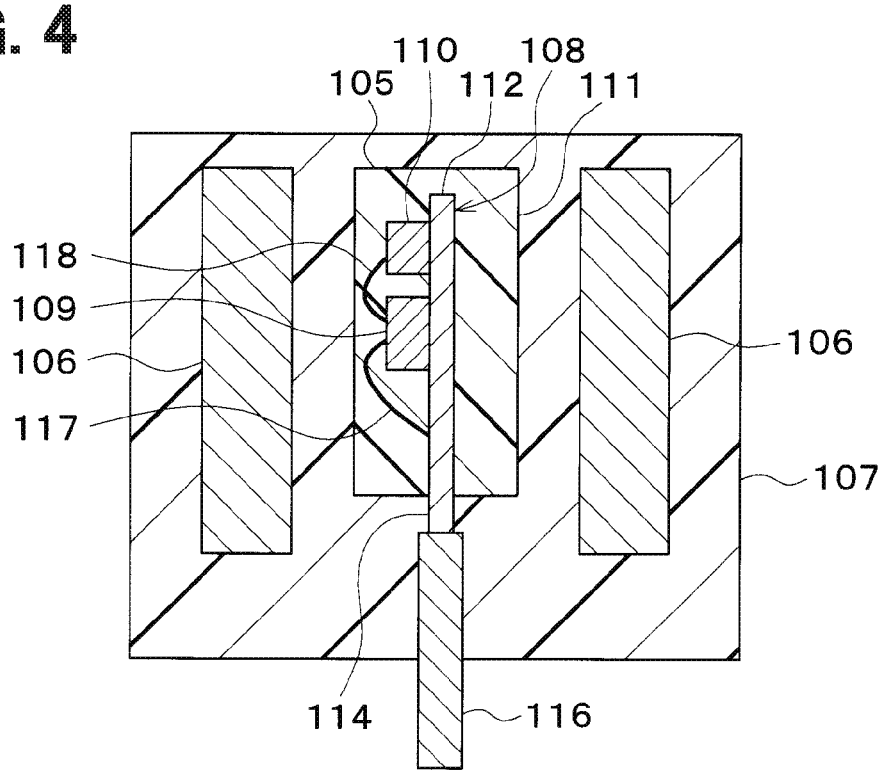
FIG. 4 is a cross-sectional view taken along a line IV-IV of FIG. 3.

As illustrated in a schematic plan view of FIG. 3 and a schematic cross-sectional view of FIG. 4, the mold IC 105, the magnet 106, and the holder 107 are integrated with each other. The main part of the mold IC 105 is disposed in a hollow part of the magnet 106. The holder 107 fixes the positions of the mold IC 105 and the magnet 106.

The mold IC 105 includes a lead frame 108, a processing circuit chip 109, a sensor chip 110, and a mold resin 111. The lead frame 108 includes a plate-like island 112 and a plurality of leads 113 to 115. The island 112 is disposed so that its flat surface is vertical to the movement direction of a detection target.

The leads 113 to 115 include a power supply terminal 113 to which a power supply voltage is applied, a ground terminal 114 to which a ground voltage is applied, and an output terminal 115 for outputting a signal. That is, the leads 113 to 115 are three leads for a power supply, ground, and a signal, respectively. A terminal 116 is connected to a distal end of each of the leads 113 to 115. The terminal 116 is disposed in the connector 104 of the container 101. The terminal 116 is also connected to a harness.

In the present embodiment, the ground lead 114 of the leads 113 to 115 is integrated with the island 112. The island 112 may be completely separated from all the leads 113 to 115.

The processing circuit chip 109 and the sensor chip 110 are mounted on the island 112 by an adhesive or the like. The processing circuit chip 109 includes a circuit that processes signals from the sensor chip 110. The sensor chip 110 includes a magnetic resistance element whose resistance value changes when being externally affected by a magnetic field. Examples of the magnetic resistance element include anisotropic magneto-resistance (AMR), giant magneto-resistance (GMR), and tunnel magneto-resistance (TMR). The leads 113 to 115 are electrically connected via wires 117 to the processing circuit chip 109. The processing circuit chip 109 is electrically connected via wires 118 to the sensor chip 110.

The mold resin 111 seals the island 112, parts of the leads 113 to 115, the processing circuit chip 109, and the sensor chip 110. The mold resin 111 is molded in a shape fixed in the hollow part of the magnet 106.

Figure 5A:
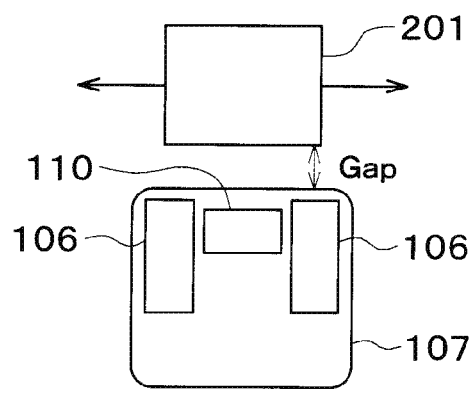
FIG. 5A illustrates a detection signal from the magnetic resistance element.
Figure 5B:
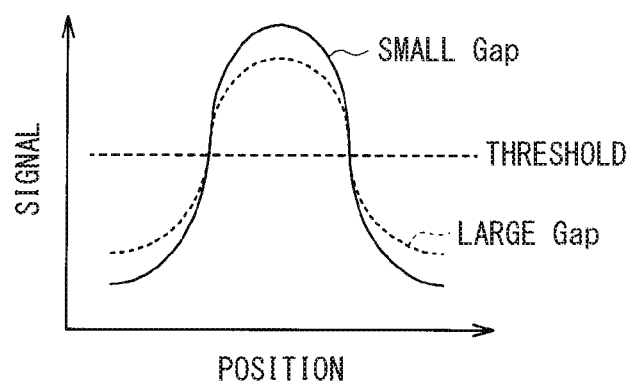
FIG. 5B illustrates the detection signal from the magnetic resistance element.

A detection signal generated by the magnetic detection system using a magnetic resistance element will be described. As illustrated in FIGS. 5A and 5B, the holder 107 is disposed with a predetermined gap to the protrusion part 201 that is a detection target. When the protrusion part 201 moves relative to the holder 107, a detection signal is maximized at the center in the movement direction of the protrusion part 201. When the gap increases, the amplitude of the detection signal decreases. On the other hand, when the gap decreases, the amplitude of the detection signal increases. It is possible to detect the position of the protrusion part 201 by setting a threshold of the detection signal.

FIG. 5A illustrates only the relationship between the movement of the protrusion part 201 and a detection signal from a magnetic detection element. The detection signal is generated by outputs of a plurality of magnetic resistance elements, which will be described later.

Figure 6:
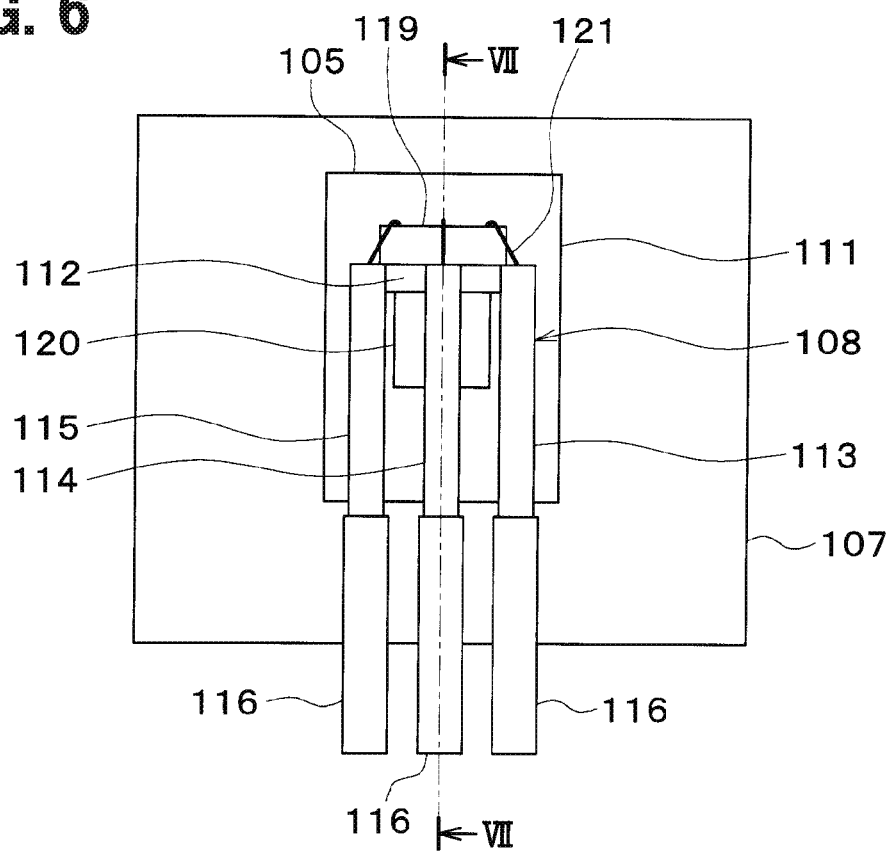
FIG. 6 is a plan view of components configuring a magnetic detection system using a Hall element.
Figure 7:
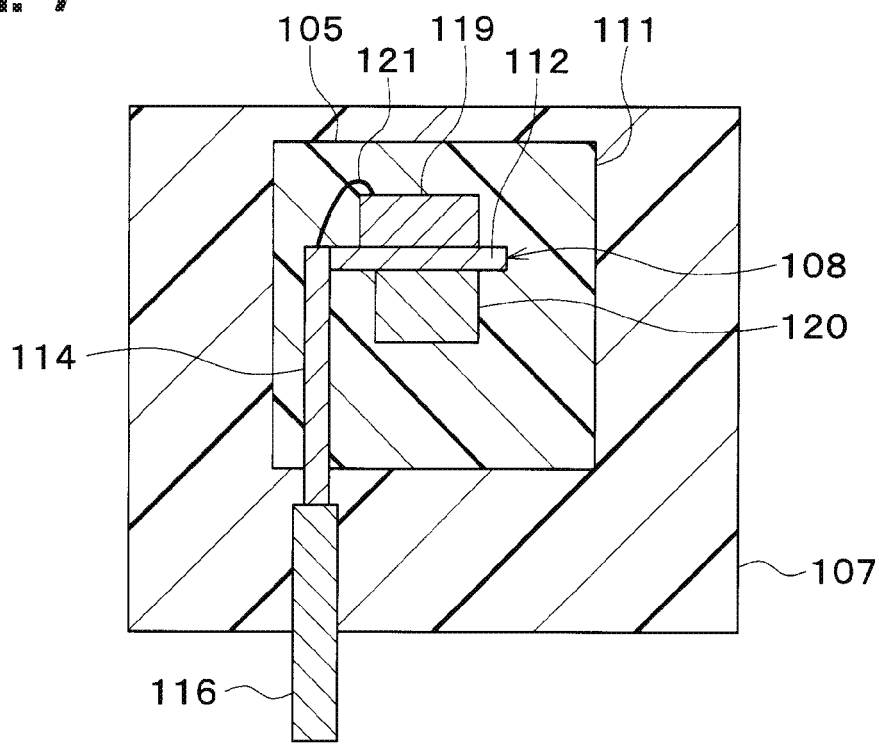
FIG. 7 is a cross-sectional view taken along a line VII-VII of FIG. 6.

When the magnetic detection system using a Hall element is used, the mold IC 105 is inserted and fixed into the holder 107 as illustrated in a schematic plan view of FIG. 6 and a schematic cross-sectional view of FIG. 7. The mold IC 105 includes the lead frame 108, an IC chip 119, a magnet 120, and the mold resin 111.

The island 112 of the lead frame 108 is disposed so that its flat surface is parallel to the movement direction of a detection target. The leads 113 to 115 each are disposed to be vertical to the movement direction of the detection target. The ground lead 114 is integrated with the island 112 so as to form a right angle with the island 112. The terminal 116 is connected to a distal end of each of the leads 113 to 115.

The IC chip 119 includes a plurality of Hall elements and a signal processing circuit. That is, the magnetic detection system using a Hall element employs a one chip configuration. The magnet 120 is fixed on a surface of the island 112 opposite to a surface on which the IC chip 119 is disposed. The leads 113 to 115 each are electrically connected via wires 121 to the IC chip 119. The mold resin 111 is molded in a shape fixed in the hollow part of the holder 107.

Figure 8A:
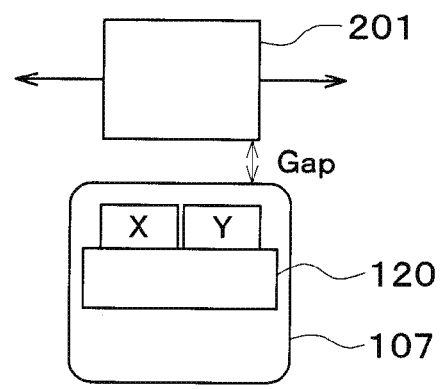
FIG. 8A illustrates a detection signal from the Hall element.
Figure 8B:
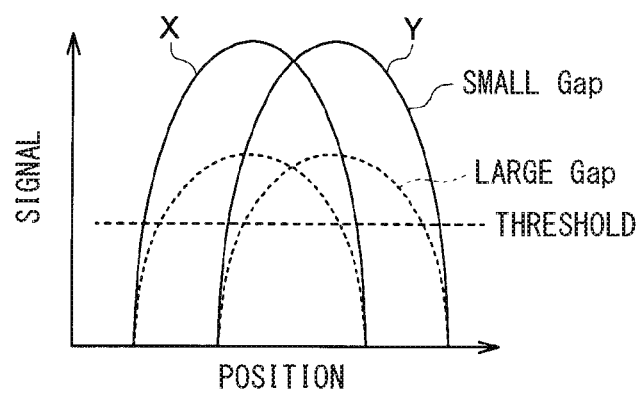
FIG. 8B illustrates the detection signal from the Hall element.

A detection signal generated by the magnetic detection system using a Hall element will be described. As illustrated in FIGS. 8A and 8B, in a case where two Hall elements (X, Y) are disposed on the magnet 120, for example, when the protrusion part 201 moves relative to the holder 107, each detection signal is maximized according to the position of each Hall element (X, Y). The relationship between a gap and the amplitude of a detection signal is similar to that of the magnetic detection system using a magnetic resistance element. It is possible to detect the position of the protrusion part 201 by setting a threshold of each detection signal.

The present embodiment employs the magnetic detection system using a magnetic resistance element. The magnetic resistance element that detects a magnetic vector has a merit of being capable of cancelling a precision error due to a variation in gap. In addition, the magnetic resistance element also has a merit of being capable of reducing or cancelling the effect of stress generated in the sensor chip 110. Consequently, it is possible to achieve detection with high precision.

Figure 9:
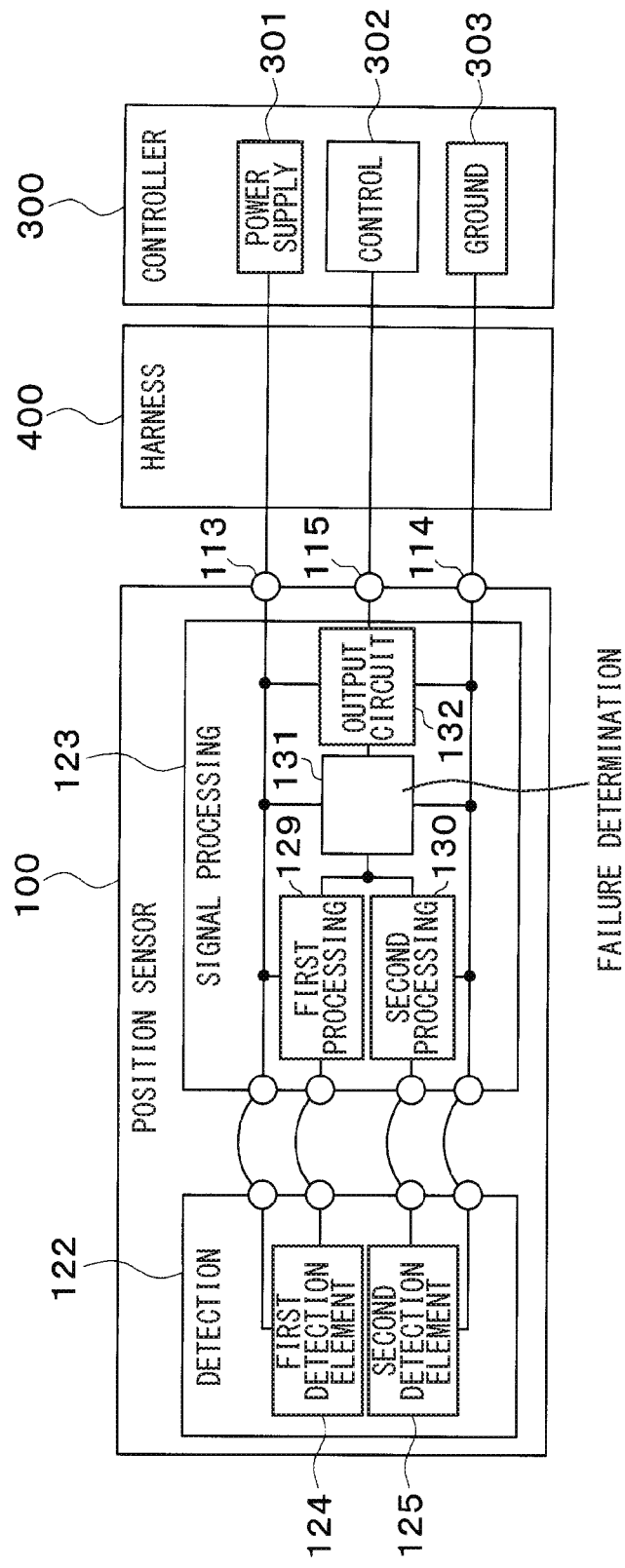
FIG. 9 is a diagram illustrating a circuit configuration of the position sensor.

Next, a circuit configuration in the sensor chip 110 and the processing circuit chip 109 will be described. As illustrated in FIG. 9, the position sensor 100 is electrically connected via a harness 400 to a controller 300. As the mold IC 105 has three leads 113 to 115 as described above, the harness 400 is constituted by three wires.

The controller 300 is, for example, a transmission controller (TCU). The controller 300 includes a power supply portion 301, a control portion 302, and a ground portion 303. The power supply portion 301 is a circuit that supplies a power supply voltage to the position sensor 100. The control portion 302 is a circuit that executes predetermined control according to an output signal input from the position sensor 100. The ground portion 303 is a circuit that sets a ground voltage of the position sensor 100. The controller 300 may be configured as an electronic controller (ECU).

The position sensor 100 includes a detection portion 122 and a signal processing portion 123. The detection portion 122 is disposed in the sensor chip 110. The signal processing portion 123 is disposed in the processing circuit chip 109. The detection portion 122 and the signal processing portion 123 operate based on a power supply voltage and a ground voltage supplied from the controller 300.

The detection portion 122 includes a first detection element 124 and a second detection element 125. The first detection element 124 is configured to output a first detection signal according to the position of the protrusion part 201. The second detection element 125 is configured to output a second detection signal according to the position of the protrusion part 201. The detection elements 124, 125 have the same configuration and output the same detection signal.

Figures 10, 11:
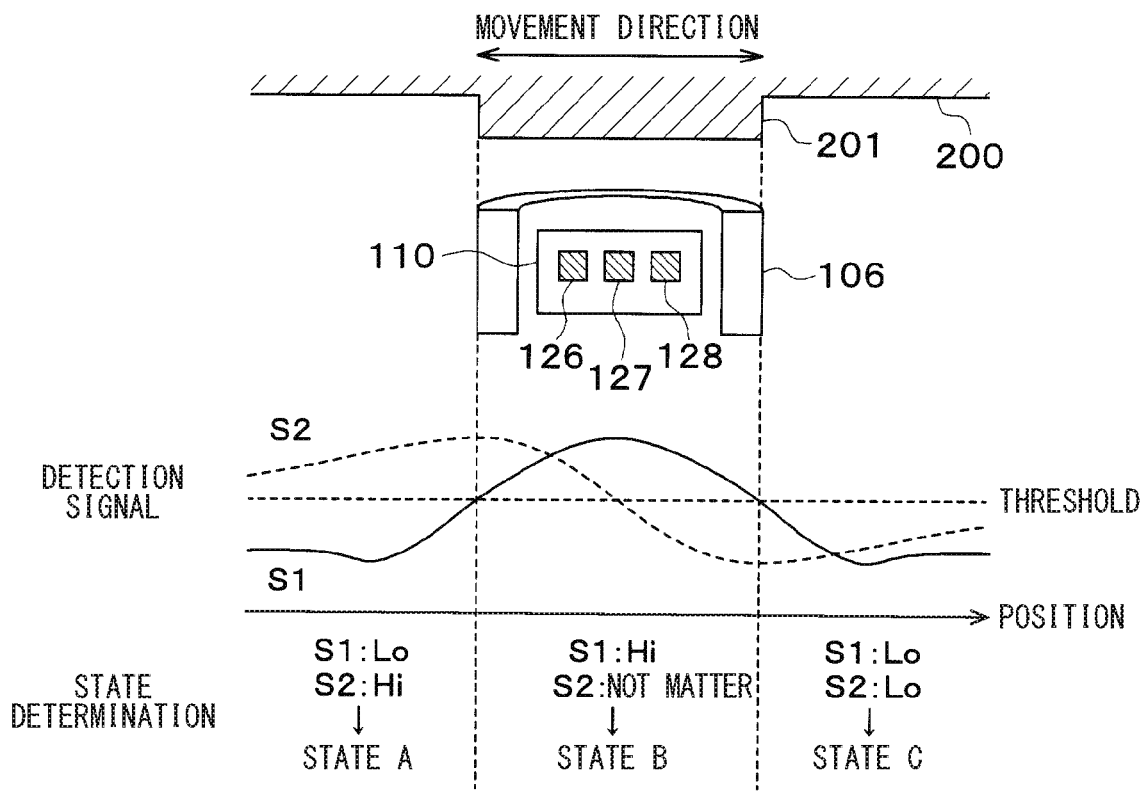
FIG. 10 is a diagram illustrating a detection signal and a state determination when three states are detected.
FIG. 11 is a chart illustrating the content of a failure determination.

As illustrated in FIG. 10, each of the detection elements 124, 125 includes three element pairs, that is, a first magnetic resistance element pair 126, a second magnetic resistance element pair 127, and a third magnetic resistance element pair 128 whose resistance values change depending on the movement of the protrusion part 201. FIG. 10 illustrates one detection element.

The first magnetic resistance element pair 126, the second magnetic resistance element pair 127, and the third magnetic resistance element pair 128 are disposed so that the second magnetic resistance element pair 127 is disposed between the first magnetic resistance element pair 126 and the third magnetic resistance element pair 128 in the movement direction of the protrusion part 201. That is, the second magnetic resistance element pair 127 is disposed to be sandwiched between the first magnetic resistance element pair 126 and the third magnetic resistance element pair 128. A bias magnetic field is applied to the second magnetic resistance element pair 127 along the central axis of the magnet 106. Meanwhile, a bias magnetic field is applied to the first magnetic resistance element pair 126 and the third magnetic resistance element pair 128 so as to surround ends of the magnet 106.

Each of the magnetic resistance element pairs 126 to 128 is configured as a half bridge circuit in which two magnetic resistance elements are serially connected between a power supply and a ground. Each of the magnetic resistance element pairs 126 to 128 detects a change in resistance value when the two magnetic resistance elements are affected by a magnetic field according to the movement of the protrusion part 201. In addition, each of the magnetic resistance element pairs 126 to 128 outputs a voltage at the intermediate point of the two magnetic resistance elements as a waveform signal based on the change in resistance value.

The detection portion 122 also includes first to fourth operational amplifiers in addition to the magnetic resistance element pairs 126 to 128. Assuming that the midpoint potential at the intermediate point of the first magnetic resistance element pair 126 is defined as V1 and the midpoint potential at the intermediate point of the second magnetic resistance element pair 127 is defined as V2. The first operational amplifier is a differential amplifier configured to calculate (V1−V2) and output the result as R1. Assuming that the midpoint potential at the intermediate point of the third magnetic resistance element pair 128 is defined as V3. The second operational amplifier is a differential amplifier configured to calculate (V2−V3) and output the result as R2.

The third operational amplifier is a differential amplifier configured to input the midpoint potential V1 from the intermediate point of the first magnetic resistance element pair 126, input the midpoint potential V3 from the intermediate point of the third magnetic resistance element pair 128, calculate (V1−V3), and output the result as S1. For example, the signal S1 has a waveform whose amplitude is maximized at the center in the movement direction of the protrusion part 201 on the shaft 200 and is minimized as being away from the protrusion part 201.

The fourth operational amplifier is a differential amplifier configured to input R1 (=V1−V2) from the first operational amplifier, input from R2 (=V2−V3) from the second operational amplifier, calculate R2−R1, and output the result as S2 (=(V2−V3)−(V1−V2)). The signal S2 has a waveform according to a recess and projection structure of the protrusion part 201 on the shaft 200. For example, the signal S2 has a waveform whose amplitude is maximized at one edge portion of the protrusion part 201 on the shaft 200 where a recess changes to a projection and is minimized at the other edge portion of the protrusion part 201 on the shaft 200 where the projection changes to the recess. The signal S2 has a waveform with a phase difference from the signal S1.

As described above, the detection elements 124, 125 each are configured to generate and acquire the signal S1 (=V1−V3) and the signal S2 (=(V2−V3)−(V1−V2)) from the outputs of the magnetic resistance element pairs 126 to 128. The detection elements 124, 125 each output the signals S1 and S2 to the signal processing portion 123 as detection signals.

The signal processing portion 123 illustrated in FIG. 9 is a circuit that processes signals input from the detection portion 122. The signal processing portion 123 includes a first processing portion 129, a second processing portion 130, a failure determination portion 131, and an output circuit 132.

The first processing portion 129 inputs a first detection signal from the first detection element 124 and specifies the position of the protrusion part 201 based on the first detection signal. The second processing portion 130 inputs a second detection signal from the second detection element 125 and specifies the position of the protrusion part 201 based on the second detection signal. For this reason, the processing portions 129, 130 each have a threshold for a detection signal.

The processing portions 129, 130 compare the signals S1 and S2, which are detection signals, to the threshold. If the signals S1 and S2 are larger than the threshold, the processing portions 129, 130 determine such a state as Hi. On the other hand, if the signals S1 and S2 are smaller than the threshold, the processing portions 129, 130 determine such a state as Lo. In addition, the processing portions 129, 130 determine the range of the shaft 200 detected by the detection elements 124, 125 based on a Hi/Lo combination of the signals S1 and S2.

Specifically, when the signal S1 is Lo and the signal S2 is Hi as illustrated in FIG. 10, the detection elements 124, 125 detect the shaft 200 on the left side of the protrusion part 201 on the drawing. That is, the processing portions 129, 130 specify the position of the shaft 200. The state of the shaft 200 when a position in such a range is specified is referred to as "state A".

Similarly, when the signal S1 is Hi, the detection elements 124, 125 detect the protrusion part 201 on the shaft 200. In this case, it does not matter whether the signal S2 is Hi or Lo. The state of the shaft 200 when a position in such a range is specified is referred to as "state B".

When the signal S1 is Lo and the signal S2 is also Lo, the detection elements 124, 125 detect the shaft 200 on the right side of the protrusion part 201 on the drawing. The state of the shaft 200 when a position in such a range is specified is referred to as "state C".

As described above, the processing portions 129, 130 specify the position of the shaft 200 as a position in one of the ranges in the movement direction of the shaft 200.

The first detection element 124 and the first processing portion 129 constitute a first system. The second detection element 125 and the second processing portion 130 constitute a second system. That is, the detection elements 124, 125 and the processing portions 129, 130 constitute a dual system.

The failure determination portion 131 is a circuit that determines whether the position specified by the first processing portion 129 matches the position specified by the second processing portion 130. The positions specified by the processing portions 129, 130 are in any of the states A to C described above. The failure determination portion 131 thus determines whether the states specified by the respective processing portions 129, 130 match. The failure determination portion 131 outputs a result of the failure determination to the output circuit 132.

The output circuit 132 controls a signal to be output to the controller 300 based on a determination result of the failure determination portion 131. When the failure determination portion 131 determines that the positions match, the output circuit 132 outputs a position signal corresponding to the position matched to the output terminal 115. On the other hand, when the failure determination portion 131 determines that the positions do not match, the output circuit 132 outputs a failure signal corresponding to a failure to the output terminal 115. The configuration of the position sensor 100 according to the present embodiment has been described above.

Next, an operation of a failure determination of the position sensor 100 will be described. As described above, the processing portions 129, 130 acquire the states A to C based on a detection signal. The processing portions 129, 130 output a signal with a value corresponding to a range that covers a specified position among discrete values set in a plurality of ranges to the failure determination portion 131.

In the present embodiment, signals with discrete values are voltage signals with different voltage values. The voltage values respectively representing the states A to C are set to discrete values so as not to overlap. For example, the state A is set to 4V, the state B is set to 3V, and the state C is set to 2V. It is only required that the discrete values do not overlap between the states A to C. Consequently, the discrete values may be set as any voltage value in a predetermined voltage range, and for example, the state A is set to 4.5V to 4V, the state B is set to 3.5V to 2.5V, and the state C is set to 2V to 1V. The predetermined voltage range may be identical between the states A to C such as within 1V. Alternatively, the predetermined voltage range may be different between the states A to C such as the state A is within 1V and the state B is within 2V.

The failure determination portion 131 determines whether a signal with a discrete value acquired from the first processing portion 129 matches a signal with a discrete value acquired from the second processing portion 130. As illustrated in FIG. 11, the failure determination portion 131 determines whether a detection result of the state of the first system constituted by the first detection element 124 and the first processing portion 129 matches a detection result of the state of the second system constituted by the second detection element 125 and the second processing portion 130 or not (Failure).

For example, when the first processing portion 129 specifies the state A, the failure determination portion 131 inputs a voltage signal of 4V from the first processing portion 129. Similarly, when the second processing portion 130 specifies the state A, the failure determination portion 131 inputs a voltage signal of 4V from the second processing portion 130. The failure determination portion 131 then determines that the signals from the processing portions 129, 130 match. That is, the state detection results by the respective systems match as the state A. When the state detection results by the respective systems match, the failure determination portion 131 determines that no failure is found in the respective systems and outputs the voltage signal of 4V to the output circuit 132.

Meanwhile, when the first processing portion 129 specifies the state B and the second processing portion 130 specifies the state C, for example, the failure determination portion 131 inputs a voltage signal of 3V from the first processing portion 129 and a voltage signal of 2V from the second processing portion 130. The failure determination portion 131 then determines that the signals from the processing portions 129, 130 do not match. When the state detection results by the respective systems do not match, the failure determination portion 131 determines that a failure occurs in any of the respective systems and outputs failure information to the output circuit 132.

The output circuit 132 outputs a signal corresponding to the failure determination result of the failure determination portion 131 to the output terminal 115. When the state detection results by the failure determination portion 131 match, the output circuit 132 outputs the voltage signal to the output terminal 115 as a position signal. For example, when the states match as the state A, the position signal is a voltage signal of 4V.

When the state detection results by the failure determination portion 131 do not match, the output circuit 132 outputs a signal with a value different from discrete values set in the respective ranges to the output terminal 115 as a failure signal. The signal with a value different from discrete values is a voltage value out of predetermined voltage ranges set in the states A to C, respectively. The voltage value is 0V or 5V, for example. The voltage value in an unallocated voltage range other than the voltage ranges set in the states A to C may be used.

The failure signal may be generated in the failure determination portion 131. In this case, the output circuit 132 outputs a failure signal input from the failure determination portion 131 to the output terminal 115.

Figure 12:
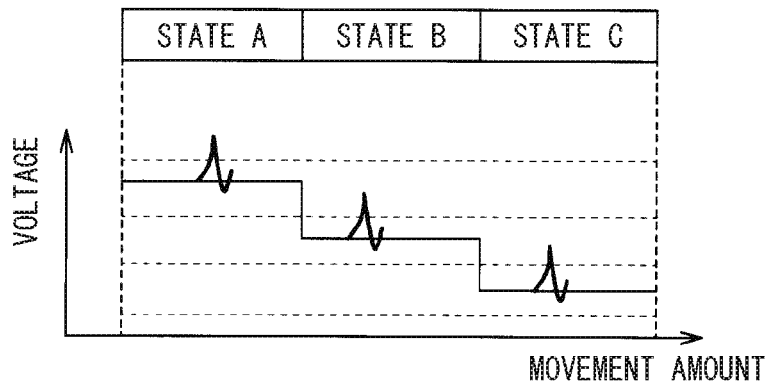
FIG. 12 is a chart illustrating a discrete voltage value in each state.

As illustrated in FIG. 12, when the protrusion part 201 moves in the movement direction of the shaft 200, a position signal has a discrete voltage value changing stepwise. If the voltage value of the position signal increases or decreases momentarily due to a noise, the position signal may reach a voltage value indicating other states. As the control portion 302 of the controller 300 reads a voltage value for a predetermined time, the influence of the noise can be substantially eliminated. That is, the position sensor 100 can output a signal with high noise resistance.

Figure 13:
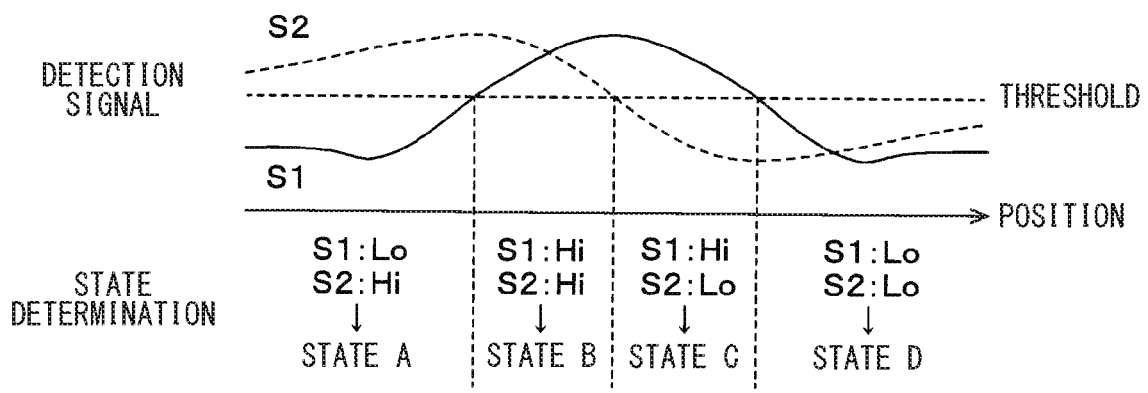
FIG. 13 is a diagram illustrating a detection signal and a state determination when four states are detected.
Figure 14:
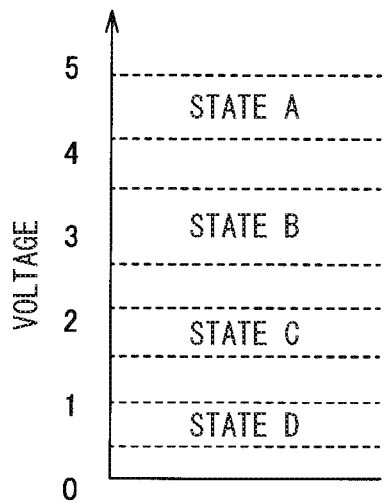
FIG. 14 is a chart illustrating discrete voltage values in four states.

As a modification, four states can be determined from detection signals as illustrated in FIG. 13. A case where the signal S1 is Lo and the signal S2 is Hi is referred to as "state A". A case where the signals S1 and S2 are Hi is referred to as "state B". A case where the signal S1 is Hi and the signal S2 is Lo is referred to as "state C". A case where the signal S1 and S2 are Lo is referred to as "state D". In this case, four discrete voltage values are respectively set in these four states as illustrated in FIG. 14.

The control portion 302 of the controller 300 inputs a position signal or a failure signal from the position sensor 100 and use the signal for desired control. Examples of the desired control include control of switching on and off a parking lamp in a meter device of a vehicle, control of permitting or prohibiting other control depending on whether a shift position is a Parking position, control of not using the position sensor 100 in case of failure, and control of switching on a failure lamp.

In some cases, the control portion 302 inputs a signal other than the position signal and the failure signal. This signal is originally impossible as an output of the position sensor 100. In this case, it is assumed that the signal is generated caused by a failure other than a failure of the position sensor 100. For example, the failure is assumed to be a failure of a communication device such as the harness 400. The controller 300 is thus capable of detecting not only the failure of the position sensor 100 but also the failure of the communication device.

Figure 15:
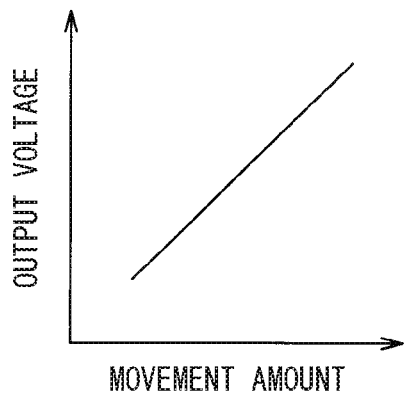
FIG. 15 is a chart illustrating an output voltage that linearly changes depending on a movement amount of a detection target.
Figure 15:
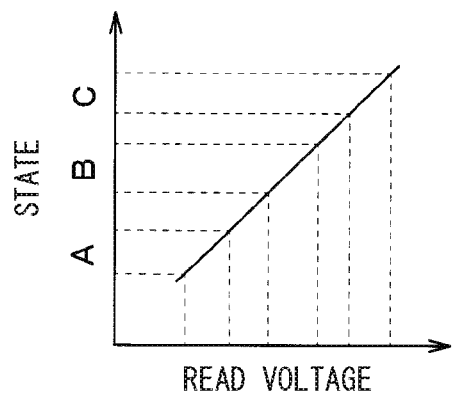

As a comparative example of the position sensor 100, a description will be given of a sensor that outputs an output voltage linearly changing with respect to the movement amount of a detection target as illustrated in FIG. 15. The controller 300 reads the linearly changing output voltage to determine the state of the detection target from the set voltage range of the output voltage. However, with this method, a voltage level may vary by an electric noise or a contact fault of a connector at its interface part such as wires, or an error may be generated in AD conversion after the controller 300 reads a voltage level. As a result, these errors lead to a read position error.

In the present embodiment, the dual system in the detection portion 122 and the signal processing portion 123 is configured to detect the position of the protrusion part 201 that is a detection target as the state of the shaft 200. In addition, it is configured that each state is output as a discrete voltage value. A read margin is provided in the controller 300, and thus the states A to C are not determined incorrectly in superimposed noise and high noise resistance is achieved. It is thus possible to secure the precision of the output of the position sensor 100.

As the position sensor 100 determines the detected range of the shaft 200 on a sensor side and then communicates with the controller 300, various error factors can be eliminated. As a result, the reliability of signals is improved. The signal communication is output as the level of a single line voltage, and thus the cost of a communication interface decreases.

Although the detection elements 124, 125 and the processing portions 129, 130 each have the dual system, a failure determination is made in the failure determination portion 131 within the position sensor 100 and a determination result is output from one output terminal 115. As system safety design requirements have become severe due to the spread of functional safety, a dual system sensor with high reliability has been demanded. Even if the detection portion 122 has the dual system, the reliability of an internal circuit is improved without increasing the number of the output terminals 115.

Consequently, it is possible to improve the reliability of the detection portion 122 while maintaining a configuration of three terminals, that is, the power supply terminal 113, the ground terminal 114, and the output terminal 115. As the output system is a discrete voltage system, failures including a contact fault and disconnection of the output terminal 115 can be detected by the controller 300. The reliability of the position sensor 100 is thus achieved.

The shaft 200 is an example of the detection target of the present disclosure.

Second Embodiment

The present embodiment will describe portions different from the first embodiment. In the present embodiment, the processing portions 129, 130 output pulse signals with different pulse widths to the failure determination portion 131 as signals with discrete values. That is, the signal with a discrete value is a pulse width modulation (PWM) signal. The discrete value is a pulse width value, a signal period, a Duty ratio, or the like.

Figure 16:
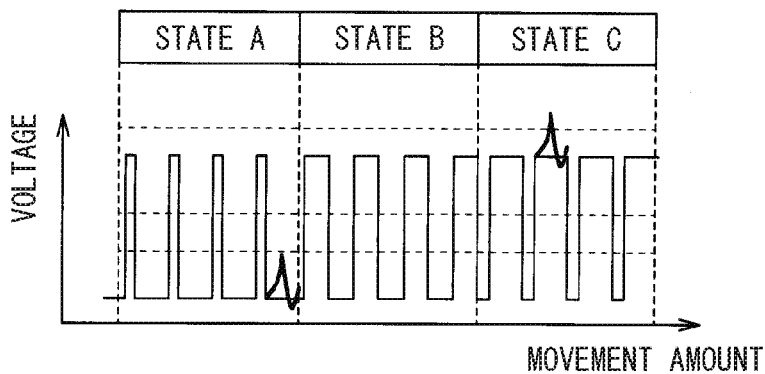
FIG. 16 is a chart illustrating a discrete pulse width in each state.

As illustrated in FIG. 16, the pulse width of a signal in the state A is set to be the narrowest and the pulse width of a signal in the state C is set to be the widest. The pulse width of a signal in the state B is set to be intermediate between the pulse width of a signal in the state A and the pulse width of a signal in the state C. It is possible to improve noise resistance as in the first embodiment.

When the failure determination portion 131 determines a failure, the output circuit 132 outputs a signal with a value different from discrete values set in the respective ranges to the output terminal 115 as a failure signal. The signal with a value different from discrete values is a signal fixed at Hi or Lo. Alternatively, a signal with a pulse width other than the respective pulse widths set in the states A to C may be used.

Figure 17:
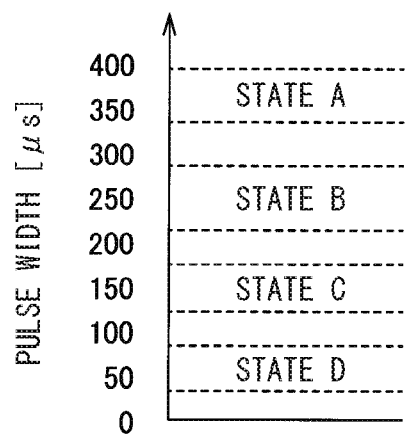
FIG. 17 is a chart illustrating discrete pulse widths in four states.

According to a modification, as illustrated in FIG. 17, when four states are determined from a detection signal, the four states are set to have four discrete pulse widths, respectively.

Other Embodiments

The configuration of the position sensor 100 described in each embodiment is an example. The configuration of the position sensor 100 is not limited to the configurations described above and may be any other configurations that achieve the present disclosure. For example, the position sensor 100 is used not only for vehicles but also for industrial robots and manufacturing facilities as a sensor detecting the positions of movable components.

In the above, the embodiment, the configuration, an aspect of the position sensor according to the present disclosure are exemplified. However, the present disclosure is not limited to every embodiment, every configuration and every aspect related to the present disclosure are exemplified. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A position sensor comprising:
a power supply terminal to which a power supply voltage is applied;
a ground terminal to which a ground voltage is applied;
an output terminal that outputs a signal;
a detection portion that operates based on the power supply voltage and the ground voltage, and detects a position of a detection target by a magnetic resistance element whose resistance value changes according to a movement of the detection target; and
a signal processing portion that operates based on the power supply voltage and the ground voltage, and processes a signal input from the detection portion,
wherein:
the detection portion includes
a first detection element that outputs a first detection signal corresponding to a position of the detection target, and
a second detection element that outputs a second detection signal corresponding to a position of the detection target;
the signal processing portion includes
a first processing portion that receives the first detection signal from the first detection element and specifies the position of the detection target based on the first detection signal,
a second processing portion that receives the second detection signal from the second detection element and specifies the position of the detection target based on the second detection signal,
a failure determination portion that determines whether the position specified by the first processing portion matches the position specified by the second processing portion, and
an output circuit that, in response to that determinations by the failure determination portion match, outputs a position signal corresponding to a matching position to the output terminal and that, in response to that the determinations by the failure determination portion do not match, outputs a failure signal corresponding to a failure to the output terminal; and
the first processing portion and the second processing portion each specifies a position of the detection target as a position in any of a plurality of ranges along a movement direction of the detection target, and outputs a signal with a discrete value corresponding to a range that covers the position specified among discrete values respectively set in the plurality of ranges to the failure determination portion.

2. The position sensor according to claim 1, wherein:
the failure determination portion determines whether a signal with a discrete value acquired from the first processing portion matches a signal with a discrete value acquired from the second processing portion;
in response to that determinations by the failure determination portion match, the output circuit outputs a matching signal to the output terminal as the position signal; and
in response to that the determinations by the failure determination portion do not match, the output circuit outputs as the failure signal, a signal with a value different from the discrete values respectively set in the plurality of ranges.

3. The position sensor according to claim 2, wherein:
the signals with the discrete values are voltage signals with different voltage values.

4. The position sensor according to claim 2, wherein:
the signals with the discrete values are pulse signals with different pulse widths.

5. The position sensor according to claim 1, wherein:
the detection target is a movable component that moves in conjunction with an operation of a shift position of a vehicle.

6. A position sensor comprising:
an output terminal that outputs a signal;
a detector that includes
- a first detection element that outputs a first detection signal corresponding to a position of a detection target, and
- a second detection element that outputs a second detection signal corresponding to a position of the detection target, so as to detect the position of the detection target by a magnetic resistance element whose resistance value changes according to a movement of the detection target; and a signal processing circuit that is configured to
- receive the first detection signal from the first detection element and specifies the position of the detection target based on the first detection signal,
- receive the second detection signal from the second detection element and specifies the position of the detection target based on the second detection signal,
- determine whether the position of the detection target based on the first detection signal matches the position of the detection target based on the second detection signal,
- in response to that the determination matches, output a position signal corresponding to a matching position to the output terminal, and
- in response to that the determination does not match, output a failure signal corresponding to a failure to the output terminal, wherein:
a first processing portion and a second processing portion each specifies a position of the detection target as a position in any of a plurality of ranges along a movement direction of the detection target, and outputs a signal with a discrete value corresponding to a range that covers the position specified among discrete values respectively set in the plurality of ranges to a failure determination portion.

\* \* \* \* \*